US008264079B2

(12) United States Patent
Iwase et al.

(10) Patent No.: US 8,264,079 B2

(45) Date of Patent: Sep. 11, 2012

(54) SEMICONDUCTOR DEVICE MOUNTED STRUCTURE AND ITS MANUFACTURING METHOD, SEMICONDUCTOR DEVICE MOUNTING METHOD, AND PRESSING TOOL

(75) Inventors: Teppei Iwase, Hyogo (JP); Yoshihiro Tomura, Osaka (JP); Kazuhiro Nobori, Osaka (JP); Yuichiro Yamada, Osaka (JP); Kentaro Kumazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 294 days.

(21) Appl. No.: 12/666,860

(22) PCT Filed: Jun. 26, 2008

(86) PCT No.: PCT/JP2008/001669

§ 371 (c)(1), (2), (4) Date: Dec. 28, 2009

(87) PCT Pub. No.: WO2009/001564

PCT Pub. Date: Dec. 31, 2008

(65) Prior Publication Data

US 2010/0181667 A1 Jul. 22, 2010

(30) Foreign Application Priority Data

Jun. 28, 2007 (JP) ................................ 2007-169975

(51) Int. Cl.
*H01L 23/48* (2006.01)

(52) U.S. Cl. ......... 257/737; 257/E21.502; 257/E23.116; 438/127; 156/580

(58) Field of Classification Search .................. 257/737, 257/E21.502, E23.116; 438/127; 156/580
See application file for complete search history.

(56) References Cited

U.S. PATENT DOCUMENTS 5,734,199 A * 3/1998 Kawakita et al. ............ 257/737

(Continued)

FOREIGN PATENT DOCUMENTS

JP 07-066326 3/1995

(Continued)

OTHER PUBLICATIONS

International Preliminary Report on Patentability and Written Opinion of the International Searching Authority (in English) issued Feb. 4, 2010 in International (PCT) Application No. PCT/JP2008/001669.

(Continued)

*Primary Examiner* — Bradley K Smith
*Assistant Examiner* — Mohammad T Karimy
(74) *Attorney, Agent, or Firm* — Wenderoth, Lind & Ponack, LLP.

(57) ABSTRACT

While bumps formed on pads of a semiconductor chip and a board having a sheet-like seal-bonding resin stuck on its surface are set face to face, the bumps and the board are pressed to each other with a tool, thereby forming a semiconductor chip mounted structure in which the seal-bonding resin is filled between the semiconductor chip and the board and in which the pads of the semiconductor chip and the electrodes of the board are connected to each other via the bumps, respectively. Entire side faces at corner portions of the semiconductor chip are covered with the seal-bonding resin. Therefore, loads generated at the corner portions due to board flexures for thermal expansion and contraction differences among the individual members caused by heating and cooling during mounting as well as for mechanical loads after mounting so that internal breakdown of the semiconductor chip can be avoided.

7 Claims, 10 Drawing Sheets

U.S. PATENT DOCUMENTS

| | | | |
|---|---|---|---|
| 5,892,289 | A | 4/1999 | Tokuno |
| 6,358,776 | B1 * | 3/2002 | Takehara et al. .............. 438/113 |
| 2006/0049522 | A1 | 3/2006 | Libres et al. |
| 2006/0113356 | A1 | 6/2006 | Matsumura et al. |
| 2009/0126877 | A1 | 5/2009 | Furuta et al. |
| 2009/0261149 | A1 | 10/2009 | Furuta et al. |

FOREIGN PATENT DOCUMENTS

| | | |
|---|---|---|
| JP | 09-289221 | 11/1997 |
| JP | 2000-299331 | 10/2000 |
| JP | 2002-359264 | 12/2002 |
| JP | 2003-109988 | 4/2003 |
| JP | 2004-087670 | 3/2004 |
| JP | 2005-32952 | 2/2005 |
| JP | 3921459 | 5/2007 |
| JP | 2007-324413 | 12/2007 |
| JP | 2008-28039 | 2/2008 |

OTHER PUBLICATIONS

International Search Report issued Jul. 29, 2008 in International (PCT) Application No. PCT/JP2008/001669.

* cited by examiner

SEMICONDUCTOR DEVICE MOUNTED STRUCTURE AND ITS MANUFACTURING METHOD, SEMICONDUCTOR DEVICE MOUNTING METHOD, AND PRESSING TOOL

TECHNICAL FIELD

The present invention relates to a semiconductor device mounted structure and its manufacturing method, as well as a semiconductor device mounting method, in which device electrodes of a semiconductor device and board electrodes of a circuit board are connected to each other via bump electrodes, respectively, while seal-bonding resin is placed between the semiconductor device and the board so that the semiconductor device is mounted on the board.

BACKGROUND ART

For electronic components, bare chip mounting that allows the mounting area to be remarkably reduced in comparison to conventional semiconductor packages has been in use. Under this condition, face-down mounting is widely used in which a circuit formation surface of a semiconductor chip (semiconductor device) and a circuit formation surface of a board are placed face to face and laid on each other via bumps (bump electrodes) formed of gold or other metal so as to obtain conduction. The face-down mounting allows a semiconductor chip as well as its whole mounted structure to be further downsized, compared with face-up mounting in which a circuit formation surface of a board and a surface of a semiconductor chip counter to its circuit formation surface are placed face to face and, in this state, metal thin wires are led out by wire bonding so that both-side terminals are connected to each other.

Among others, the sheet bonding technique in which bumps formed on pads of the semiconductor chip and the board having sheet-like seal-bonding resin stuck on its surface are set face to face and pressed to each other makes it possible to simultaneously carry out the filling of the seal-bonding resin between semiconductor chip and board and the connection of the pads of the semiconductor chip and the electrodes of the board, thus being effective for process simplification and time reduction and being in widespread use.

Patent Literature 1: JP 2003-109988 A

Patent Literature 2: JP 2005-32952 A

In recent years, advancements have been being made toward lower dielectric constants of insulating material inside the chip with a view to scaling-down of chip-inside interconnections for size and cost reductions of semiconductor packages. With regard to such low-dielectric-constant insulating materials (hereinafter, referred to as "low-k materials"), as the dielectric constant decreases, the insulating material becomes more fragile in terms of mechanical strength, posing a fear of internal breakdown of semiconductor chips caused by the fragility of low-k materials in semiconductor chip mounting process.

In general, the coefficient of thermal expansion of a semiconductor chip is extremely smaller than those of seal-bonding resin (underfill) and the board. Therefore, thermal expansion differences or thermal contraction differences among the individual members caused by heating and cooling in a mounting operation cause large stress loads to be generated at portions of the semiconductor chip. Particularly at corner portions of a rectangular-shaped semiconductor chip, the stuck sheet-like seal-bonding resin does not flow out enough, so that side faces of the semiconductor chip are exposed.

Therefore, stress loads at the corner portions have a larger effect, causing a likelihood that cracks or peeling may occur after the mounting.

In order to reduce these and other loads, for example, Patent Literature 1 shows a method in which sealing resin flowing out during the press of the semiconductor chip is blocked with a metallic tool having a metallic protruding portion used for the pressing of the semiconductor chip, thus making it easier to form a fillet portion (foot expanding portion) around the semiconductor chip. However, in the method of Patent Literature 1, the metallic tool cannot permit variations in configuration and posture and the like of the board or positional shifts of the semiconductor chip, giving rise to a problem that the fillet portion becomes unstable in terms of variations. On the other hand, Patent Literature 2 proposes a method in which not a metallic tool but an elastic member tool typified by a rubber one is used as the tool for pressing the semiconductor chip so that the seal-bonding resin around the semiconductor chip is heated and hardened by the elastic member, thus allowing the fillet portion to be formed stably around the semiconductor chip. However, in the method of Patent Literature 2, the fillet amount (resin amount) of corners of the semiconductor chip is not enough with side faces of the semiconductor chip not covered but exposed as well, so that the semiconductor chip cannot be protected enough. Moreover, deformation of the elastic member inhibits enough loads from being transferred to the semiconductor chip, posing a fear that inter-electrode junction cannot be secured.

SUMMARY OF THE INVENTION

Accordingly, an object of the present invention, lying in solving the above-described issues, is to provide a semiconductor device mounted structure and a semiconductor device mounting method, as well as a pressing tool for use in the mounting method, in which device electrodes of a semiconductor device and board electrodes of a board are connected to each other via bump electrodes, respectively, and in which a seal-bonding resin is placed between the semiconductor device and the board so that the semiconductor device is mounted on the board, the device and the method being capable of reducing loads generated at corner portions of the semiconductor device due to board flexures for thermal expansion differences and thermal contraction differences among the individual members caused by heating and cooling in a mounting operation as well as for mechanical loads after the mounting operation so that internal breakdown of the semiconductor device mounted structure can be avoided.

In order to achieve the above object, the present invention has the following constitutions.

According to a first aspect of the present invention, there is provided a semiconductor device mounting method comprising:

placing a semiconductor device on a semiconductor device mounting area of a board with a seal-bonding resin interposed therebetween;

with use of a pressing tool including a pressing member formed of a rigid material having a flat surface formed larger in planar shape than the semiconductor device, and an elastic member set around the flat surface of the pressing member, pressing an upper surface of the semiconductor device by the flat surface of the pressing member so that device electrodes of the semiconductor device and board electrodes of the board are connected to each other via bump electrodes, respectively, while an opposing area between the semiconductor device and the board is sealed with a resin and, concurrently, part of the resin is pushed and expanded outward of the opposing area so that the resin expanding outward of the opposing area is filled into a space surrounded by the flat surface of the pressing tool, the elastic member and side faces of the semiconductor device outside the corner portions of the semiconductor device; and thereafter, heating and hardening the resin so that a fillet portion, which is an expanding portion of the seal-bonding resin outward of the opposing area between the semiconductor device and the board, is formed outside the opposing area, thereby forming a mounted structure of the semiconductor device in which entire side faces at least of the corner portions of the semiconductor device are covered with the fillet portion while a flat surface is formed at a top portion of the fillet portion so as to extend along an upper surface of the semiconductor device.

According to a second aspect of the present invention, there is provided the semiconductor device mounted structure manufacturing method as defined in the first aspect, wherein the semiconductor device pressing operation is carried out by using the pressing tool including a tool body portion formed of a rigid material, the elastic member fixed to a lower surface of the tool body portion, and the pressing member attached at a center of a lower surface of the elastic member.

According to a third aspect of the present invention, there is provided the semiconductor device mounted structure manufacturing method as defined in the first aspect, wherein the semiconductor device pressing operation is carried out by using the pressing tool in which a metal plate is used as the pressing member.

According to a fourth aspect of the present invention, there is provided the semiconductor device mounted structure manufacturing method as defined in the first aspect, wherein the semiconductor device pressing operation is carried out by using the pressing tool in which the elastic member is formed so as to protrude from the flat surface of the pressing member.

According to a fifth aspect of the present invention, there is provided the semiconductor device mounted structure manufacturing method as defined in the first aspect, further comprising:

making the resin expand over the entire opposing area by a semiconductor device pressing operation with the pressing tool;

thereafter, hardening the seal-bonding resin, thereby forming a semiconductor device mounted structure in which the entire side faces of all peripheries of the semiconductor device are covered with the fillet portion.

According to a sixth aspect of the present invention, there is provided the semiconductor device mounted structure manufacturing method as defined in the first aspect, further comprising:

during the semiconductor device pressing operation by the pressing tool, pressing the seal-bonding resin filled into the space surrounded by the flat surface of the pressing tool, the elastic member and side faces of the semiconductor device with the elastic member, while deforming the elastic member; and thereafter, hardening the resin, thereby forming a semiconductor device mounted structure in which a concavely curved surface is formed in the fillet portion at positions close to corner portions of the semiconductor device.

According to a seventh aspect of the present invention, there is provided the semiconductor device mounted structure manufacturing method as defined in the first aspect, wherein during the semiconductor device pressing operation by the pressing tool, the seal-bonding resin is filled so as to form the space surrounded by the flat surface of the pressing tool, the elastic member and the side faces of the semiconductor device so that a space capacity close to corner portions of the semiconductor device become larger than a space capacity close to end portions between neighboring corner portions of the semiconductor device.

According to an eighth aspect of the present invention, there is provided a semiconductor device mounted structure comprising:

a semiconductor device having a plurality of device electrodes;

a board having a plurality of board electrodes;

a plurality of bump electrodes for connecting the device electrodes and the board electrodes to each other, respectively; and a sealing-bonding resin which seals the device electrodes, the board electrodes and the bump electrodes, respectively, and which is placed between the semiconductor device and the board so as to make the semiconductor device and the board bonded to each other, wherein a fillet portion, which is an expanding portion of the seal-bonding resin outward of the opposing area between the semiconductor device and the board, is placed outside the opposing area, and a mounted structure of the semiconductor device in which entire side faces at least of the corner portions of the semiconductor device are covered with the fillet portion while a flat surface is formed at a top portion of the fillet portion so as to extend along an upper surface of the semiconductor device.

According to a ninth aspect of the present invention, there is provided the semiconductor device mounted structure as defined in the eighth aspect, wherein the entire side faces of all peripheries of the semiconductor device are covered with the fillet portion.

According to a tenth aspect of the present invention, there is provided the semiconductor device mounted structure as defined in the eighth aspect, wherein the fillet portion has a concavely curved surface at positions close to corner portions of the semiconductor device.

According to an eleventh aspect of the present invention, there is provided the semiconductor device mounted structure as defined in the tenth aspect, wherein a top portion of the concavely curved surface is positioned outwardly away from the corner portions of the semiconductor device, and the flat surface of the fillet portion is positioned between a corner portion of the semiconductor device and the top portion of the concavely curved surface.

According to a twelfth aspect of the present invention, there is provided the semiconductor device mounted structure as defined in the eighth aspect, wherein the fillet portion is so formed that a resin amount of the fillet portion near a corner portion of the semiconductor device is larger than a resin amount of the fillet portion near an end portion between neighboring corner portions of the semiconductor device.

According to a 13th aspect of the present invention, there is provided a semiconductor device mounting method comprising:

placing a semiconductor device on a semiconductor device mounting area of a board with a seal-bonding resin interposed therebetween;

pressing the semiconductor device against the board with the seal-bonding resin interposed therebetween so that device electrodes of the semiconductor device and board electrodes of the board are connected to each other via bump electrodes, respectively, while the device electrodes, the board electrodes and the bump electrodes are sealed with the resin, respectively, and, concurrently, making entire side faces of corner portions of the semiconductor device covered with the resin while the seal-bonding resin expanding outward of the mounting area is inhibited from moving upward of the upper surface of the semiconductor device; and thereafter, heating and hardening the seal-bonding resin so that the semiconductor device is mounted onto the board while a fillet portion, which is an expanding portion of the seal-bonding resin outward of the mounting area, is formed outside the mounting area, thereby forming a mounted structure of the semiconductor device in which entire side faces at least of the corner portions of the semiconductor device are covered with the fillet portion while a flat surface is formed at a top portion of the fillet portion so as to extend along an upper surface of the semiconductor device.

According to a 14th aspect of the present invention, there is provided a pressing tool for pressing a semiconductor device against a board with a seal-bonding resin interposed therebetween so that a plurality of device electrodes of the semiconductor device and a plurality of board electrodes of the board are connected to each other via bump electrodes, respectively, while the device electrodes, the board electrodes and the bump electrodes are sealed, by which the semiconductor device is mounted onto the board, the pressing tool comprising:

a pressing member which is formed of a rigid material and having a flat surface formed larger in planar shape than the semiconductor device; and an elastic member which is set around the flat surface of the pressing member.

According to a 15th aspect of the present invention, there is provided the pressing tool as defined in the 14th aspect, further comprising:

a tool body portion which is formed of a rigid material, wherein the elastic member is set on a lower surface of the tool body portion, and the pressing member is attached to a center of a lower surface of the elastic member.

According to a 16th aspect of the present invention, there is provided the pressing tool as defined in the 15th aspect, wherein the pressing member is a metal plate.

According to a 17th aspect of the present invention, there is provided the pressing tool as defined in the 14th aspect, wherein the elastic member is formed so as to protrude from the flat surface of the pressing member.

According to the present invention, since the entire side faces at the corner portions of the semiconductor device can be covered with the seal-bonding resin, stress loads generated at corner portions of the semiconductor device due to board flexures for thermal expansion differences and thermal contraction differences among the individual members caused by heating process and cooling process in mounting operation of the semiconductor device as well as for mechanical loads after the mounting operation can be reduced by the seal-bonding resin placed so as to cover the side faces of the corner portions, so that internal breakdown of the semiconductor device mounted structure can be avoided.

BRIEF DESCRIPTION OF DRAWINGS

These aspects and features of the present invention will become clear from the following description taken in conjunction with the preferred embodiments thereof with reference to the accompanying drawings, in which.

DETAILED DESCRIPTION OF THE INVENTION

Figure 1:
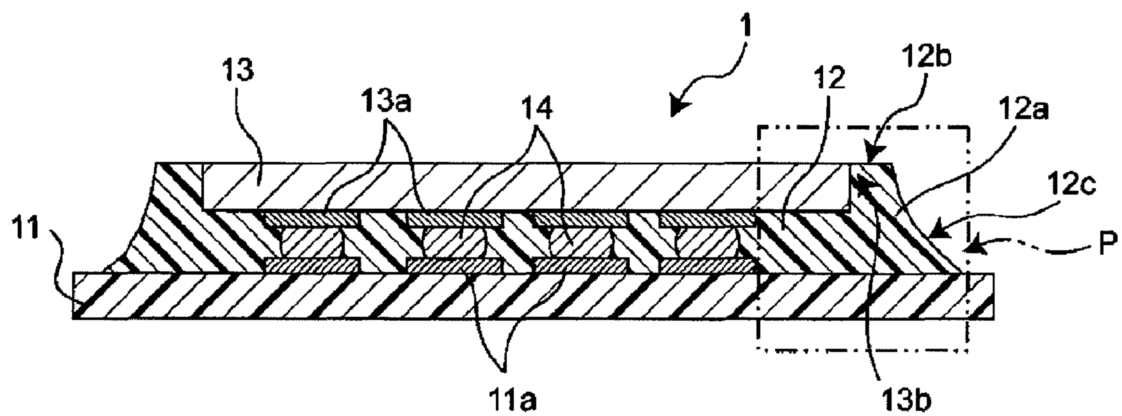
FIG. 1 is a schematic sectional view of a semiconductor chip mounted structure according to a first embodiment of the invention.

Before the description of the present invention proceeds, it is to be noted that like parts are designated by like reference numerals throughout the accompanying drawings.

Hereinbelow, embodiments according to the present invention will be described in detail with reference to the accompanying drawings.

First Embodiment

Figure 2:
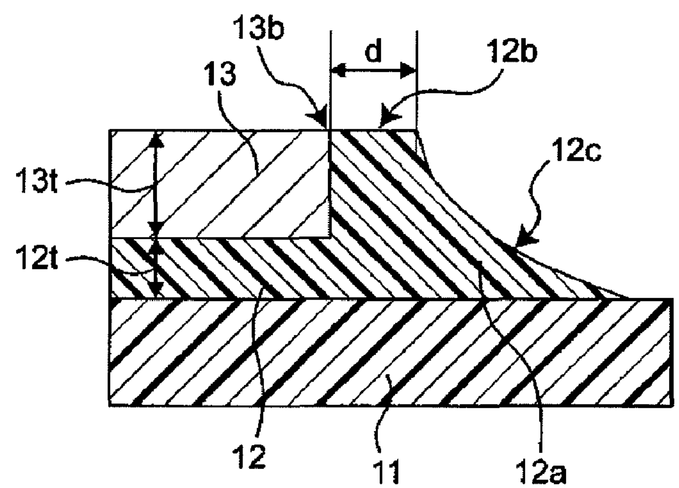
FIG. 2 is an enlarged schematic sectional view of a portion P of the mounted structure of FIG. 1.
Figure 3:
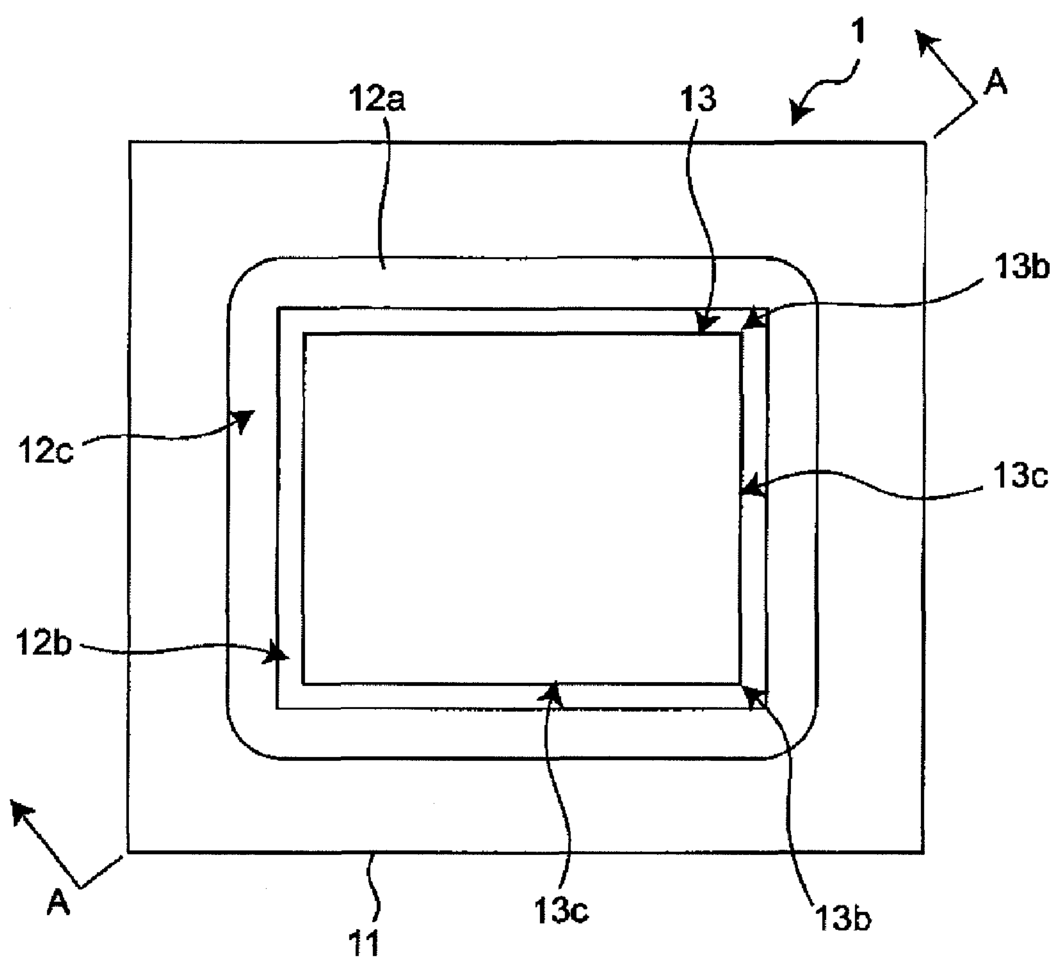
FIG. 3 is a schematic plan view of the mounted structure of FIG. 1.

FIG. 1 shows a schematic sectional view of a semiconductor chip mounted structure 1 which is an example of a semiconductor device mounted structure according to a first embodiment of the invention. FIG. 2 is an enlarged schematic sectional view of a portion P of the mounted structure 1 of FIG. 1, and FIG. 3 is a schematic plan view of the mounted structure 1. In addition, FIG. 1 is a sectional view taken along the line A-A of FIG. 3.

As shown in FIGS. 1 and 3, in the semiconductor chip mounted structure 1 of this first embodiment, a sealing resin (e.g., sheet-like underfill) 12 as an example of the seal-bonding resin is set on a board 11, and a semiconductor chip 13 is mounted via the sealing resin 12. A plurality of pads **13*a* as an example of device electrodes are formed on a circuit formation surface, lower-side surface in the figure, of the semiconductor chip 13. In correspondence to formation positions of these pads 13*a*, a plurality of board electrodes 11*a* are formed on a circuit formation surface, upper-side surface in the figure, of the board 11. The individual pads 13*a* are electrically connected to the individual board electrodes 11*a*, respectively, via bumps 14 which are an example of bump electrodes. Also, the sealing resin 12, which is formed of an insulative resin material, fully covers and seals the mutually electrically connected pads 13***a*, board electrodes 11*a* and bumps 14 while, with a view to maintaining this connection state, being interposed between the semiconductor chip 13 and the board 11 to bond these two members to each other. In such a state, the semiconductor chip 13 is mounted on the board 11, by which the semiconductor chip mounted structure 1, i.e., semiconductor package component, is made up.

As shown in the schematic plan view of FIG. 3, the sealing resin 12 is so placed as to expand outward of an opposing area (or mounting area) of the semiconductor chip 13 and the board 11, so that a fillet portion 12*a*, which is a foot expanding portion as shown in the schematic sectional view of FIG. 1, is formed. It is noted that although embodiments of the invention are and will be described on a case, as an example, in which the "fillet portion" is a foot expanding portion of the sealing resin placed outside the opposing area of the semiconductor chip and the board, yet the "fillet portion" is not limited to such a case only. The "fillet portion" may have a form other than the foot expanding form. In the individual embodiments of the invention, the term "fillet portion" refers to sealing resin placed outside the opposing area of the semiconductor chip and the board, and may be given in various forms.

As shown in the enlarged partial schematic sectional view of FIG. 2, the fillet portion 12*a* is formed so as to have a generally trapezoidal cross section, and an entire side face in a corner portion 13*b* of the semiconductor chip 13 having a rectangular shape in plane view is not exposed but covered with the sealing resin 12 of the fillet portion 12*a*. Although not shown in cross section, an entire side face in an end portion (side portion) 13*c* between neighboring corner portions 13*b* of the semiconductor chip 13 is similarly covered with the sealing resin 12. That is, in the semiconductor chip 13, side faces in its entire perimeter are not exposed but covered with the sealing resin 12, so that side faces of the semiconductor chip 13 are protected.

Further, as shown in FIG. 2, the fillet portion 12*a* with which the corner portion 13*b* of the semiconductor chip 13 is covered is so formed that its upper surface (top portion) is a flat surface 12*b* which is flush with an upper surface of the semiconductor chip 13 shown in the figure and which extends next to this upper surface. Also, an inclined surface is formed so as to extend outwardly from an outer peripheral end portion of the flat surface of the fillet portion 12*a* to a surface of the board 11 in a smooth foot expanding shape, the inclined surface being formed as a concavely curved surface 12*c*.

First, since the flat surface 12*b* of the upper surface of the fillet portion 12*a* is formed flush with the upper surface of the semiconductor chip 13, it becomes more easily achievable, after formation of the semiconductor chip mounted structure 1, to stack another semiconductor chip on top of the mounted structure. In this first embodiment, the outer peripheral end portion of the flat surface 12*b* of the fillet portion 12*a*, which is formed flush with the upper surface of the semiconductor chip 13, is located at a position (position of distance d) 0.1 mm or more distant from the corner portion 13*b* of the semiconductor chip 13 as shown in FIG. 2.

Also, since the concavely curved surface 12*c* is formed in the fillet portion 12*a*, the fillet portion 12*a* can be formed over a larger width from the upper surface of the semiconductor chip 13 to the surface side of the board 11, and moreover a terminal end portion of the fillet portion 12*a* and the surface of the board 11 can be made smaller in bonding-interface angle so that stress concentration on the semiconductor chip 13 due to thermal deformation of individual members caused by temperature variations can be avoided. In this first embodiment, for example, the curvature of the curve of the concavely curved surface 12*c* is set to a value or more obtained by summing up a thickness 13*t* of the semiconductor chip 13 and a bonding height 12*t* of the sealing resin 12.

Here is explained a dimensional example of the semiconductor chip mounted structure 1 in this first embodiment. For example, the semiconductor chip 13 has a planar outer size of 10 mm×10 mm with a thickness of 200 μm. The board 11 has a planar outer size of 15 mm×15 mm with a thickness of 500 μm. In the mounted structure 1, a distance between the semiconductor chip 13 and the board 11, i.e., a height of a space into which the sealing resin 12 is filled and placed is 25 μm.

Figure 4:
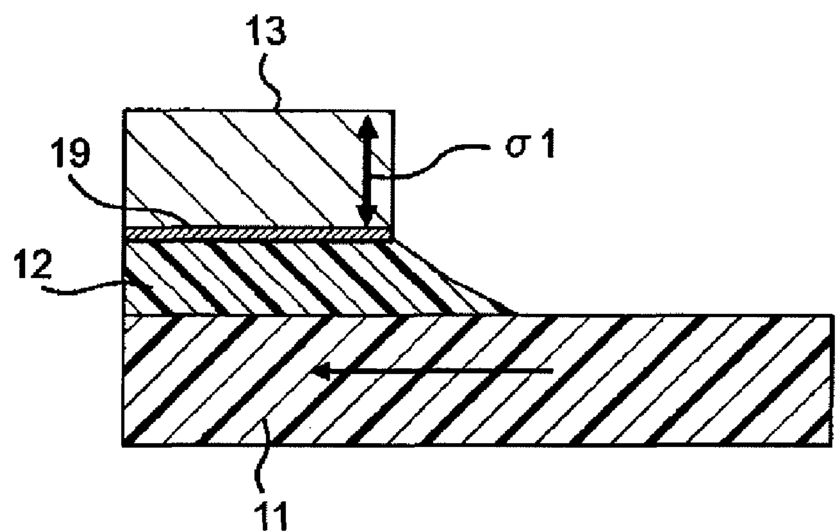
FIG. 4 is a schematic sectional view of a vicinity of the fillet portion of a mounted structure according to a comparative example of the first embodiment.

Now, an effect of the formation of the fillet portion 12*a* that covers the entire side face of the semiconductor chip 13 in the semiconductor chip mounted structure 1 of this first embodiment is explained with reference to the schematic explanatory views of FIGS. 4 and 5. FIG. 4 is a schematic explanatory view of a comparative example with the side face of the semiconductor chip 13 not covered but exposed, and FIG. 5 is a schematic explanatory view showing the mounted structure 1 of the first embodiment.

Figure 5:
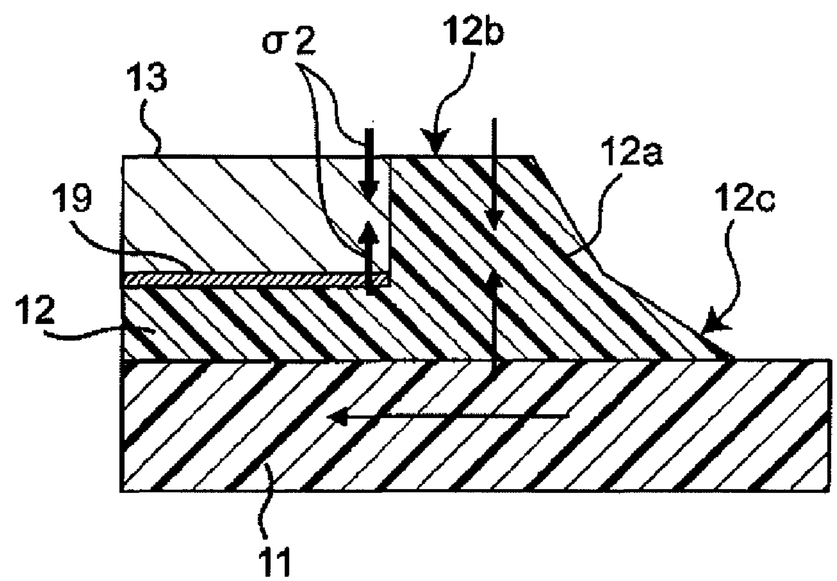
FIG. 5 is a schematic sectional view of a vicinity of the fillet portion of the mounted structure according to the first embodiment.

As shown in FIGS. 4 and 5, an insulating film 19 which is called the most fragile low-k material is provided on one side of the semiconductor chip 13 opposite to the board 11. In a mounted structure 51 of the comparative example shown in FIG. 4, since the side face of the semiconductor chip 13 is not covered but exposed, thermal contraction of the board 11 during heating or cooling process or the like causes a tensile stress $\sigma 1$ to occur in a vertical direction in the side face of the semiconductor chip 13. Such a tensile stress $\sigma 1$ acts to make the insulating film 19 of the semiconductor chip 13 peeled off, so that internal breakdown of the semiconductor chip 13 becomes more likely to occur.

In contrast to this, in the mounted structure 1 of the first embodiment shown in FIG. 5, the entire side face of the semiconductor chip 13 is not exposed but covered with the fillet portion 12*a*. With such a structure adopted, occurrence of thermal contraction of the board 11 causes the fillet portion 12*a* to be thermally contracted as well, so that the side face of the semiconductor chip 13 has a compressive stress $\sigma 2$ arising in the vertical direction. Thus, peeling of the insulating film 19 of the semiconductor chip 13 can be suppressed, so that the likelihood of occurrence of the internal breakdown can be reduced.

Further, in the mounted structure 1 of the first embodiment, since the entire side face of the semiconductor chip 13 is covered with the fillet portion 12*a*, the stress applied to the semiconductor chip 13 can be dispersed over the entire side face, so that occurrence of any local stress concentration can be prevented. Generally, a multiplicity of microcracks are present in a side face of the semiconductor chip 13. Such microcracks are formed due to mechanical factors such as dicing of the semiconductor wafer or material characteristics of the semiconductor chip. Therefore, for example, with adoption of a constitution that part of the side face of the semiconductor chip is covered with the fillet portion while the rest of the side face is exposed from the fillet portion, stress concentration may occur to the microcracks in the side face of the semiconductor chip at the boundary between the fillet portion's covering portion and the exposed portion, causing the semiconductor chip to be damaged. However, by the arrangement that the entire side face of the semiconductor chip 13 in which a multiplicity of microcracks are present is securely covered with the fillet portion 12*a* as in this first embodiment, occurrence of stress concentration in the side face of the semiconductor chip 13 can be suppressed so that the semiconductor chip 13 can be prevented from being damaged.

Also, since the flat surface 12*b* in the upper surface of the fillet portion 12*a* is formed flush with the upper surface of the semiconductor chip 13, the fillet portion can be prevented from going around onto the upper surface of the semiconductor chip 13 while the fillet portion 12*a* is enabled to securely cover the entire side face of the semiconductor chip 13. In the case where the fillet portion goes around onto part of the upper surface of the semiconductor chip 13, there is a fear that the stress caused by thermal deformation (thermal contraction or thermal expansion) of the fillet portion 12*a* is locally concentrated onto the upper surface of the semiconductor chip 13. However, by forming the flat surface 12*b* as in the first embodiment, occurrence of stress concentration on the upper surface of the semiconductor chip 13 can be prevented.

Further, for conventional mounted structures, it is considered that the sealing resin for bonding the semiconductor chip and the board to each other is preferably a material low in coefficient of linear expansion (i.e., a material relatively less contractile due to heat; e.g., with the coefficient of linear expansion less than 44 ppm) in order to suppress thermal deformation due to temperature changes. However, in the mounted structure 1 of the first embodiment, since the structure that the entire side face of the semiconductor chip 13 is covered is adopted, stress in a contracting direction is aggressively applied to the side face of the semiconductor chip 13 by thermal contraction, so that occurrence of peeling of the insulating film 19 is prevented beforehand. Therefore, using a material having a coefficient of linear expansion as high as 44 ppm or more (i.e., a material relatively highly contractile due to heat) is preferable. That is, by using a sealing resin that is more easily contractible due to thermal effects than sealing resins of conventional use, the fillet portion 12*a* can be thermally contracted to generate the compressive stress σ2 that acts vertically on the side face of the semiconductor chip 13. Thus, occurrence of peeling of the insulating film 19 of the semiconductor chip 13 can be suppressed, so that the likelihood of occurrence of the internal breakdown can be reduced.

Figure 6:
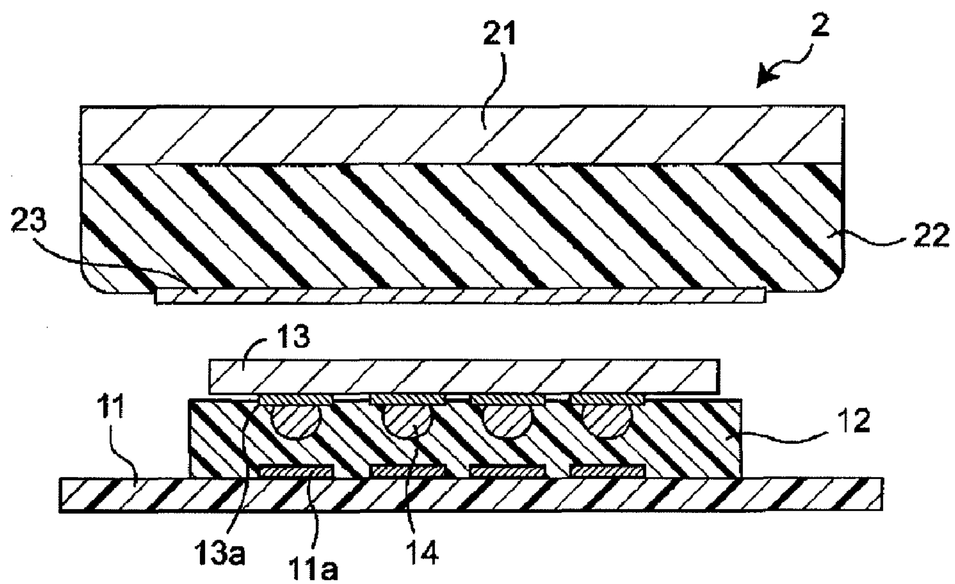
FIG. 6 is a schematic explanatory view of a mounted structure manufacturing method according to the first embodiment (before pressing)
Figure 7:
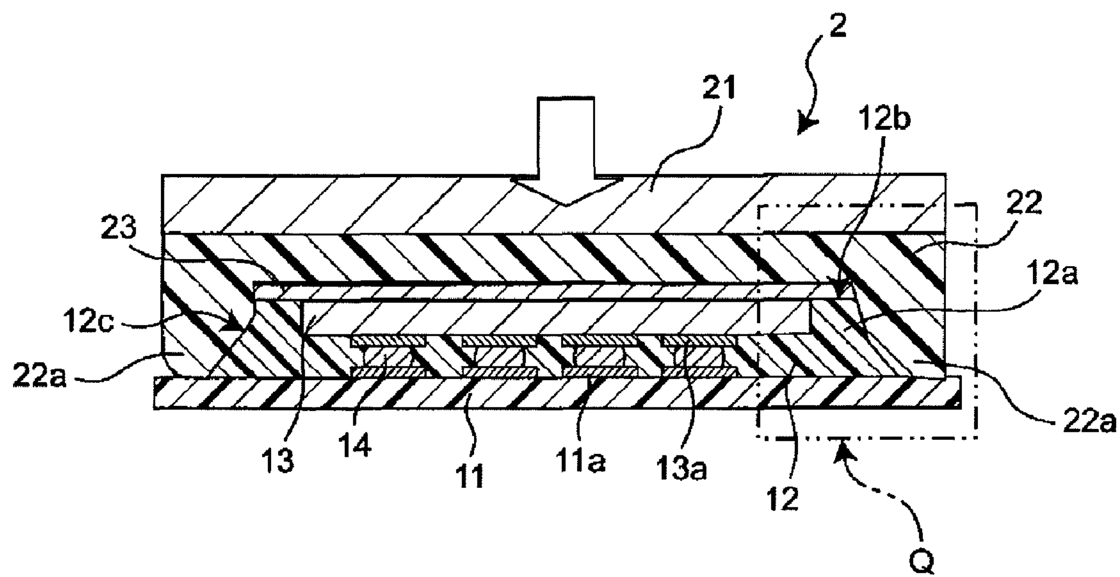
FIG. 7 is a schematic explanatory view of the mounted structure manufacturing method according to the first embodiment (during pressing)
Figure 8:
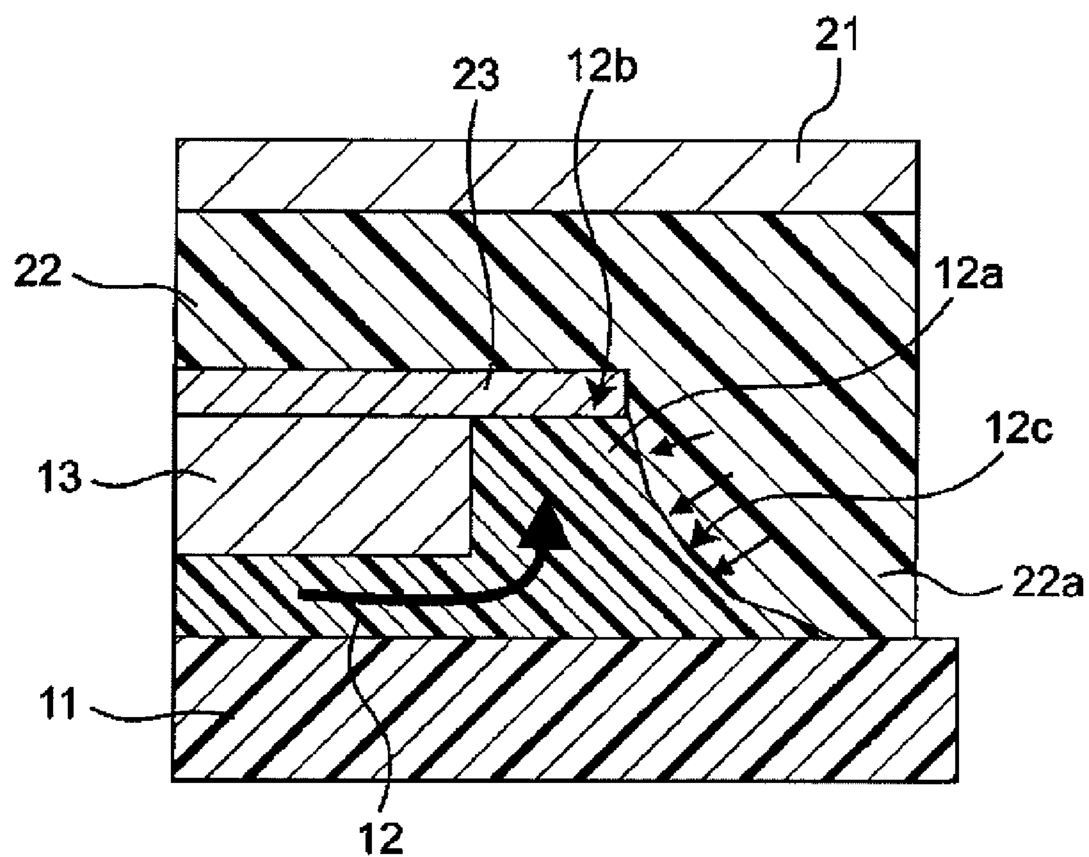
FIG. 8 is an enlarged schematic sectional view of a portion Q of the mounted structure of FIG. 7.
Figure 9:
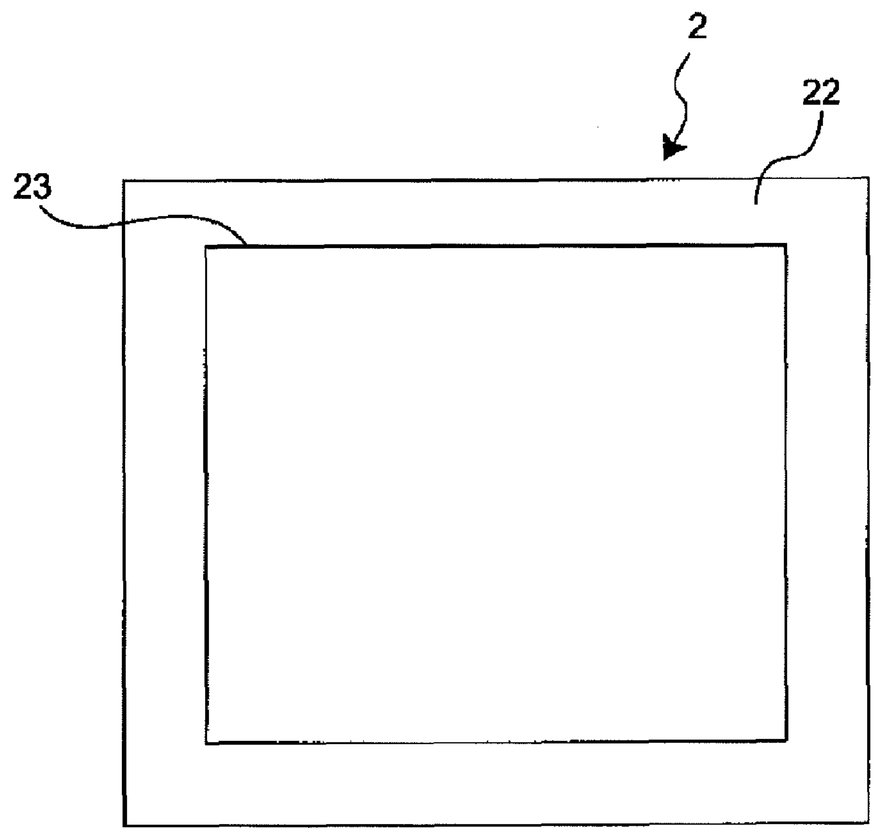
FIG. 9 is a schematic plan view of a pressing surface of the tool in the first embodiment.

Next, a method for manufacturing the semiconductor chip mounted structure 1 of the first embodiment is described with reference to the accompanying drawings. FIGS. 6 and 7 are schematic sectional views showing states in which the semiconductor chip 13 is being mounted on the board 11. FIG. 8 is an enlarged schematic sectional view of a portion Q in FIG. 7, and FIG. 9 is a schematic plan view of a pressing surface (flat surface) of the tool for mounting process.

Before the description of the manufacturing method proceeds, a structure of a tool (pressing tool) 2 for pressing process is explained. As shown in FIGS. 6 and 9, the tool 2 includes a tool body portion 21 formed of, e.g., a metal material as a rigid material, an elastic member 22 attached on a lower surface of the tool body portion 21 and typified by a rubber material (elastomer) or the like, and a metal thin plate 23 (an example of the pressing member) formed of, e.g., a metal material as a rigid material attached at a center of a lower surface of the elastic member 22. The tool body portion 21 is moved up or down by an unshown up/down unit so as to be enabled to apply a specified pressing force to the semiconductor chip 13. Further, the tool body portion 21 is equipped with an unshown heating unit so as to be enabled to heat the semiconductor chip 13 and the sealing resin 12 by heat conduction as described later. The metal thin plate 23 is formed so as to have an outer shape which is rectangular in plane view and which is one-size larger than the outer shape of the semiconductor chip 13. In addition, the outer shape of the metal thin plate 23 is coincident with the outer shape of the flat surface 12*b* of the fillet portion 12*a* in the mounted structure 1 of FIG. 1. That is, the metal thin plate 23 is so formed that its outer shape is, for example, 0.1 mm or more larger than the outer shape of the semiconductor chip 13. The elastic member 22 is so formed as to have an even larger outer shape than the outer shape of the metal thin plate 23 and, for example, formed into enough size to enclose the entirety of the fillet portion 12*a* in the mounted structure 1. In addition, both the elastic member 22 and the metal thin plate 23 have their planar shape formed into rectangular shapes in conformity to the shape of the semiconductor chip 13.

In more detail, the manufacturing method for the semiconductor chip mounted structure 1 will be described. First, as shown in FIG. 6, a board 11 with a semiconductor chip 13 set thereon via a sealing resin 12 in its mounting area is prepared. Then, after alignment between the tool 2 and the semiconductor chip 13 of the board 11, the tool 2 as a whole is moved down. The metal thin plate 23 in the tool 2 is brought into contact with the upper surface of the semiconductor chip 13, and the tool 2 is moved further down, by which the semiconductor chip 13 is pressed by the metal thin plate 23. In this operation, with a protective sheet (not shown) between the semiconductor chip 13 and the tool 2, the tool 2 is brought into contact with the semiconductor chip 13 via the protective sheet for preventing adhesion of the sealing resin 12 onto the tool 2 or the like. As the semiconductor chip 13 is pressed like this, the sealing resin 12 is pushed away transverse. Also, by the contact between the metal thin plate 23 and the semiconductor chip 13, the sealing resin 12 is heated by heat conduction with an unshown heating unit of the tool 2, so that the sealing resin 12, which is a thermosetting resin as an example, is thrown into a molten state, which allows the transverse push and flow of the resin to be more smoothly achieved.

Further, as shown in FIGS. 7 and 8, the elastic member 22 in part where the metal thin plate 23 is attached is elastically compressed, so that the elastic member 22 around the metal thin plate 23 is protruded downward from the metal thin plate 23. By this protruding portion 22*a* of the elastic member 22, the flow of the sealing resin 12 pushed away transverse is limited so as to be blocked. By balance between a push-away discharge pressure and elastic force of the elastic member 22, the blocked sealing resin forms a foot-expanding fillet portion 12*a* having a smooth concavely curved surface 12*c* as shown in FIG. 8. Further, the blocked sealing resin 12 is swollen upward along the side face of the semiconductor chip 13, and its flow in the vertical direction is limited so as to be finally blocked by the metal thin plate 23 in contact with the upper surface of the semiconductor chip 13. As a result, the fillet portion 12*a* covers the entire side face of the semiconductor chip 13 while a flat surface 12*b* is formed on top thereof. That is, a space surrounded by the side face of the semiconductor chip 13, the metal thin plate 23, the elastic member 22 and the board 11 is formed around the semiconductor chip 13, and the sealing resin 12 is filled into the space, by which the entire side face of the semiconductor chip 13 is covered and moreover the fillet portion 12*a* having the flat surface 12*b* in its upper surface can be formed. In this way, the sealing resin 12 forms the fillet portion 12*a* in a shape surrounded by the side face of the semiconductor chip 13, the protruding portion 22*a* of the elastic member 22 and the metal thin plate 23. With such a configuration maintained, the sealing resin 12 is further heated and thereby thermally hardened, so that the mounted structure 1 having the semiconductor chip 13 mounted on the board 11 is formed.

The metal used for the tool body portion 21 of the tool 2 may be selected from various types including aluminum, copper and iron, where the metal is desirably as hard as possible to ensure the rigidity of the tool. In this case, use of stainless steel is preferable.

As the elastic member 22 attached to the tool body portion 21, rubber having a hardness of 40 to 80 is used, its thickness being a value, or more, obtained by summing up the height 13*t* of the semiconductor chip 13 and the bonding height 12*t* of the sealing resin 12.

With use of rubber (elastomer) having a hardness of less than 40, the pressure applied to the semiconductor chip 13 becomes lower, resulting in deterioration of initial resistance and connection reliability. On the other hand, with use of rubber having a hardness of more than 80, the pressure applied to the fillet portion becomes lower, causing occurrence of voids in the sealing resin 12 and leading to deterioration of connection reliability. Herein, the hardness (rubber hardness) is referenced by Standards conforming to JIS S 6050. Such a rubber material is exemplified by natural rubber or synthetic rubber, and use of silicone rubber is preferable in terms of thermal resistance and pressure tightness.

Also for the metal thin plate 23 of the tool 2, various types of materials such as aluminum, copper and iron are available, but it is preferable to use stainless steel, which is a rigid material, in consideration of the wear resistance of its contact surface and, moreover, coat the surface of the stainless steel with diamond.

Further, for better mold releasability from the extruded sealing resin 12, the surface of the metal thin plate 23 is preferably subjected to processes such as coating of a fluorine- or silicon-based mold releasing agent, or organic thin film or other mold releasing process.

Figure 10:
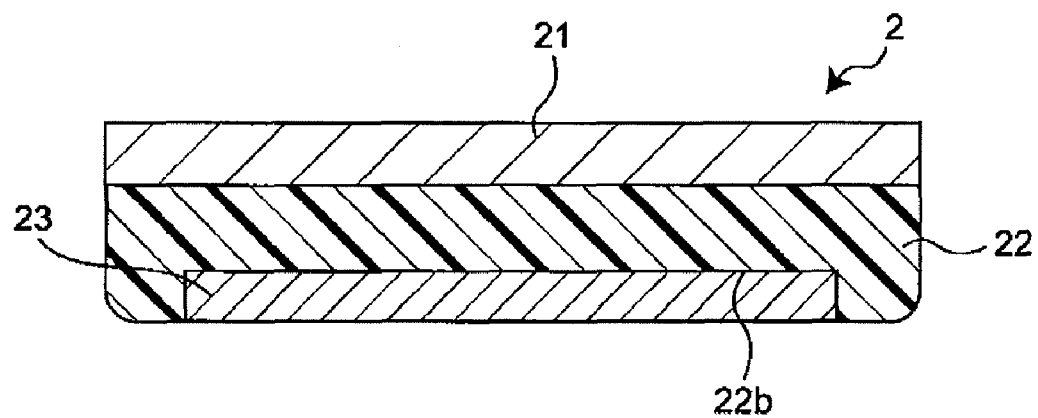
FIG. 10 is a schematic sectional view of a tool according to a modification of the first embodiment.

The attachment of the metal thin plate 23 to the elastic member 22 is done by fixing the metal thin plate 23 to a lower surface of the elastic member 22 as shown in FIG. 6. Instead of such a case, as shown in the schematic sectional view of FIG. 10, a recess portion 22*b* corresponding to configuration and thickness of the metal thin plate 23 may be formed in the elastic member 22, and the metal thin plate 23 may be fixed so as to be embedded into the recess portion 22*b*. With this structure, the thickness of the elastic member between the tool body portion 21 and the metal thin plate 23 can be reduced, so that the rigidity of the tool 2 as a whole can be improved, thus suppressing occurrence of positional shifts in the pressing of the semiconductor chip 13. Further, providing a thinner elastic member of lower thermal conduction makes the thermal conduction of the tool 2 as a whole improved, allowing stable heating to be achieved as a resulting effect.

In the mounted structure 1 formed by using such a tool 2, the outer shape of the fillet portion 12*a* can be formed into a generally rectangular frame shape to take after the outer shape of the semiconductor chip 13, as shown in the schematic plan view of FIG. 3. That is, the fillet portion 12*a* is formed around the metal thin plate 23 by limiting the transverse flow of the molten sealing resin 12 with the protruding portion 22*a* of the elastic member 22, so that the generally rectangular frame-shaped fillet portion 12*a* can be formed. Thus, by forming the outer shape of the fillet portion 12*a* into a generally rectangular frame shape, the sealing resin 12 can be led to vicinities of the corner portion 13*b*, where the sealing resin 12 is relatively hard to flow, so that the side face of the corner portion 13*b* can securely be protected.

Second Embodiment

The present invention may be carried out in other various modes without being limited to the above embodiment. For example, a semiconductor chip mounted structure manufacturing method according to a second embodiment of the invention is described with reference to the schematic sectional views of FIGS. 11, 12 and 13. In addition, FIG. 13 is an enlarged partial schematic sectional view of a portion R in FIG. 12.

Figure 11:
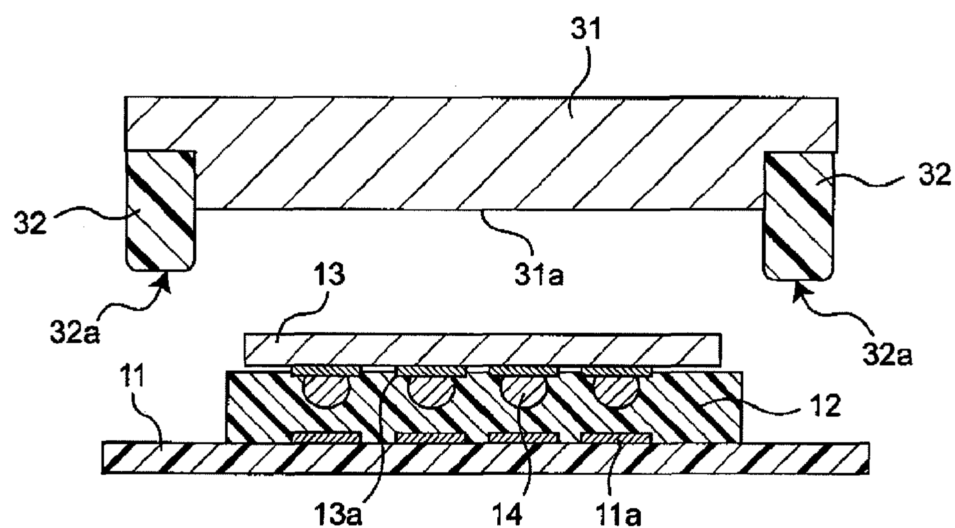
FIG. 11 is a schematic explanatory view of a semiconductor chip mounted structure manufacturing method according to a second embodiment of the invention (before pressing)
Figure 12:
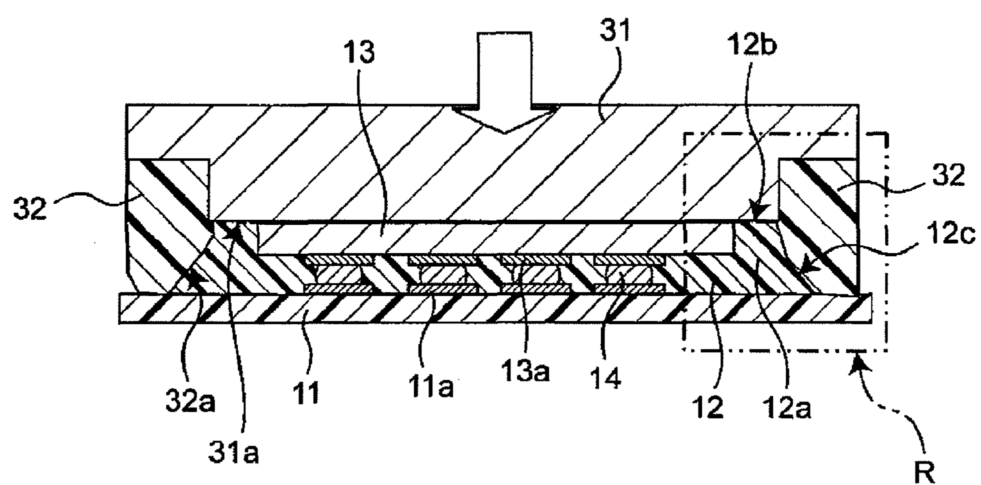
FIG. 12 is a schematic explanatory view of the mounted structure manufacturing method according to the second embodiment (during pressing)
Figure 13:
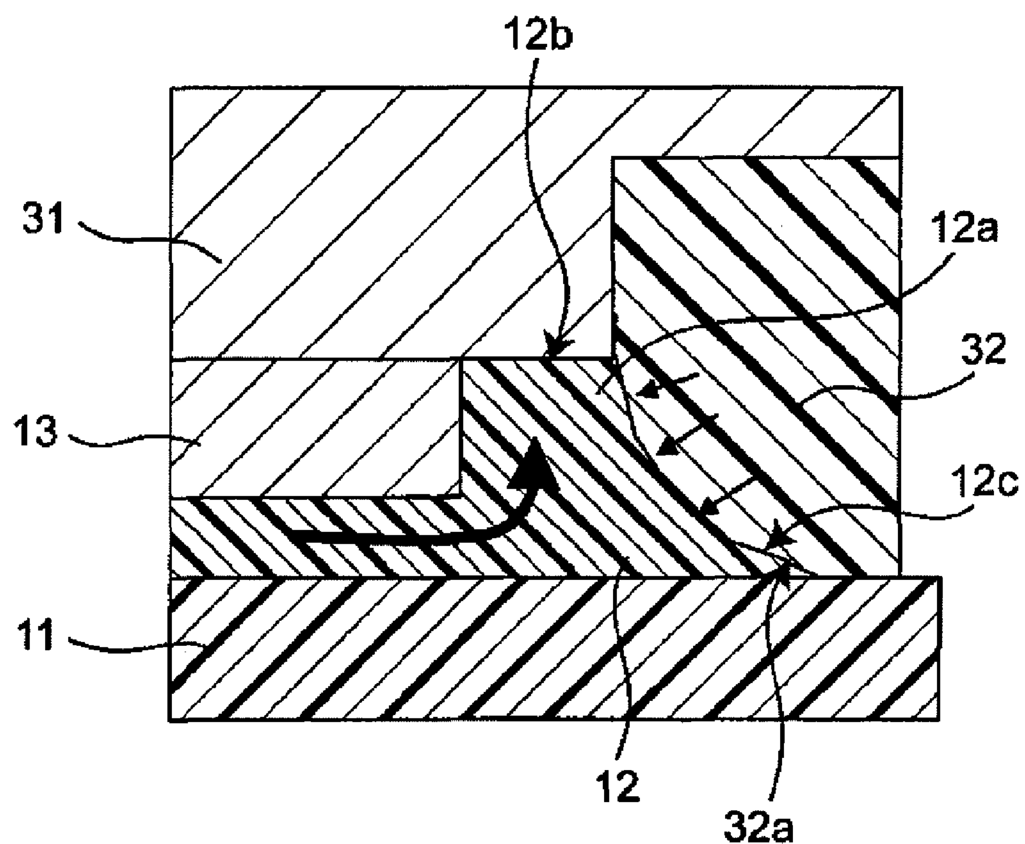
FIG. 13 is an enlarged schematic sectional view of a portion R of the mounted structure of FIG. 12.

As shown in FIGS. 11 and 12, in the manufacturing method of the second embodiment, a tool 3 different in structure from the tool 2 of the first embodiment is used. The tool 3 includes a tool body portion 31 as an example of the pressing member having, at its lower surface, a pressing surface 31*a* for the semiconductor chip 13, and an elastic member 32 placed all around the pressing surface 31*a* of the tool body portion 31 so as to surround the pressing surface 31*a*. The pressing surface 31*a* of the tool body portion 31 is formed larger than the planar outer shape of the semiconductor chip 13 and equivalent to the outer shape of the flat surface 12*b* of the fillet portion 12*a*. The elastic member 32 has a protruding portion 32*a* protruded downward from the pressing surface 31*a* of the tool body portion 31.

With use of the tool 3 having such a structure as shown above, as shown in FIGS. 12 and 13, the sealing resin pressed via the semiconductor chip 13 is moved transverse by the pressing surface 31*a*, while the protruding portion 32*a* of the elastic member 32 therearound is brought into contact with the board 11, so that the flow of the moving sealing resin 12 is limited so as to be blocked. The blocked sealing resin 12 is swollen upward, being filled so as to take after the shapes of the side face of the semiconductor chip 13 and the pressing surface 31*a*. As a result, the fillet portion 12*a* of the sealing resin 12 is formed so as to cover the entire side face of the semiconductor chip 13 while having the flat surface 12*b*, which is flush with the upper surface of the semiconductor chip 13, and a concavely curved portion 12*c*.

A protruding height to which the protruding portion 32*a* of the elastic member 32 protrudes from peripheries of the tool body portion 31 is preferably set to a value, or more, obtained by summing up the height 13*t* of the semiconductor chip 13 and the bonding height 12*t* of the sealing resin 12 so that the sealing resin 12 is kept in successful contact with the board 11 and that a proper pressure can be applied to the sealing resin 12.

Also, by formation of an inclined surface at a portion of the protruding portion 32*a* of the elastic member in contact with the fillet portion 12*a*, the concavely curved portion 12*c* of the fillet portion 12*a* can be formed more securely.

Third Embodiment

Figure 14:
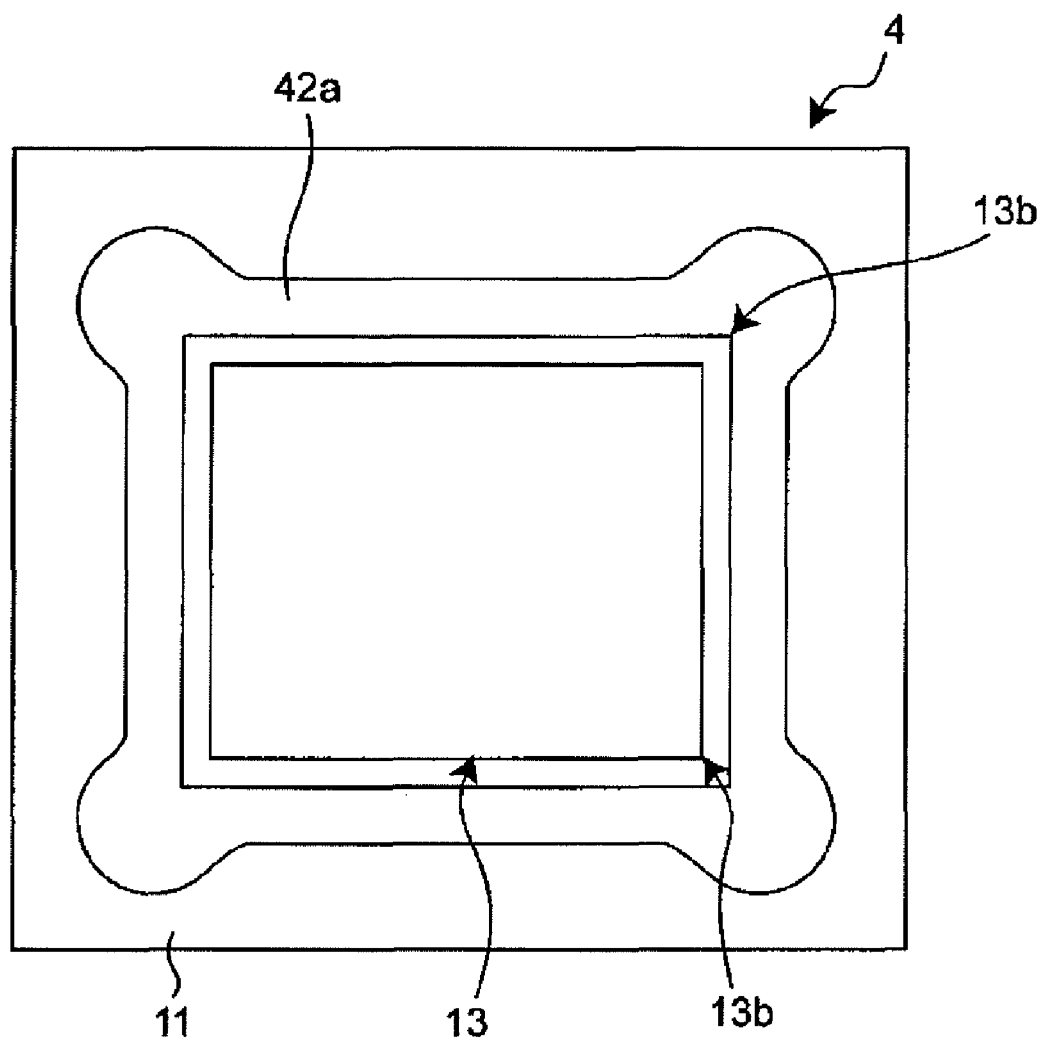
FIG. 14 is a schematic plan view of a semiconductor chip mounted structure according to a third embodiment of the invention.

Next, FIG. 14 is a schematic plan view of a semiconductor chip mounted structure 4 according to a third embodiment of the invention.

As shown in FIG. 14, the mounted structure 4 of the third embodiment differs from the foregoing first and second embodiments in that a fillet portion 42*a* is formed so as to be relatively larger in resin amount at vicinities of corner portions 13*b* of a semiconductor chip 13 where stress caused by thermal contraction and the like of the board 11 or the like is more likely to be concentrated. In the mounted structure 4 of such a structure, since the corner portions 13*b* are protected enough, internal breakdown of the semiconductor chip 13 can be prevented further effectively.

Figure 15:
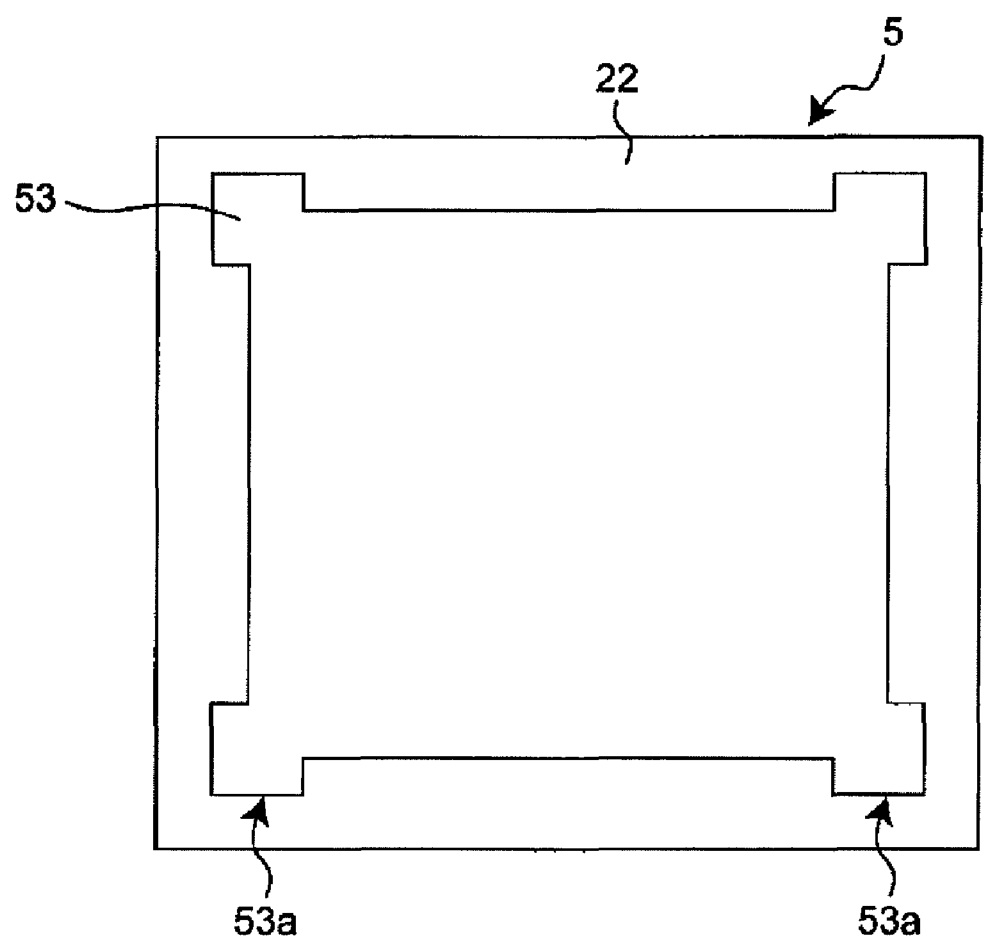
FIG. 15 is a schematic plan view of a pressing surface of the tool in the third embodiment.

The fillet portion 42*a* of such a structure can be formed by using, for example, a tool 5 shown in the schematic plan view of FIG. 15. More specifically, as shown in FIG. 15, the tool 5 includes a tool body portion and an elastic member 22 similar to those of the first embodiment. Then, a metal thin plate 53 fixed to the elastic member 22 is so formed as to be protruded outward only at the corner portions, i.e., outwardly protruded portions 53*a* in plane view are formed at the corner portions, by which a mounted structure 4 of the third embodiment can be formed.

The foregoing individual embodiments have been described on a structure in which side faces of the corner portions 13*b* and the side portions 13*c* are entirely covered with the sealing resin 12 in a semiconductor chip mounted structure. However, the invention is not limited to such cases only. In the semiconductor chip 13, if at least the entire side faces of the four corner portions 13*b* are covered with the sealing resin 12, effects of the present invention can be obtained. In particular, since the insulating film 19 is relatively liable to peeling at the corner portions 13*b* of the semiconductor chip 13, it is effective, for prevention of breakdown of the semiconductor chip 13, to cover at least the entire side faces of the four corner portions 13*b* with the sealing resin 12 as shown above.

Also, although the above description has been made on a structure in which the flat surface 12*b* in the fillet portion 12*a* is formed so as to be flush with the upper surface of the semiconductor chip 13. Instead of such a case, it is also possible to adopt a structure in which the top portion of the fillet portion 12*a* is swollen upward from the upper surface of the semiconductor chip 13. Only with adoption of a structure in which the entire side faces are covered with the sealing resin 12, the effect of the invention for preventing the internal breakdown of the semiconductor chip 13 can be obtained.

It is to be noted that, by properly combining the arbitrary embodiments of the aforementioned various embodiments, the effects possessed by them can be produced.

In the semiconductor device mounted structure of the invention, since the entire side faces at the corner portions of the semiconductor device are covered with the seal-bonding resin, the corner portions can securely be protected. Therefore, tensile loads generated at corner portions of the semiconductor device due to board flexures for thermal expansion differences and thermal contraction differences among the individual members caused by heating process and cooling process in mounting operation as well as for mechanical loads after the mounting operation can be reduced, so that internal breakdown of the semiconductor device can be avoided, hence the usefulness of the invention.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2007-169975 filed on Jun. 28, 2007, including specification, claims, and drawings is incorporated herein by reference in its entirety.

The invention claimed is:

1. A semiconductor device mounting method comprising:

placing a semiconductor device on a semiconductor device mounting area of a board with a seal-bonding resin interposed therebetween;

with use of a pressing tool including a pressing member formed of a rigid material having a flat surface formed larger in planar shape than the semiconductor device, and an elastic member set around the flat surface of the pressing member, pressing an upper surface of the semiconductor device by the flat surface of the pressing member so that device electrodes of the semiconductor device and board electrodes of the board are connected to each other via bump electrodes, respectively, while an opposing area between the semiconductor device and the board is sealed with the resin and, concurrently, part of the resin is pushed and expanded outward of the opposing area so that the resin expanding outward of the opposing area is filled into a space surrounded by the flat surface of the pressing tool, the elastic member and side faces of the semiconductor device outside the corner portions of the semiconductor device; and thereafter, heating and hardening the resin so that a fillet portion, which is an expanding portion of the seal-bonding resin outward of the opposing area between the semiconductor device and the board, is formed outside the opposing area, thereby forming a mounted structure of the semiconductor device in which entire side faces at least of the corner portions of the semiconductor device are covered with the fillet portion while a flat surface is formed at a top portion of the fillet portion so as to extend along an upper surface of the semiconductor device.

2. The semiconductor device mounted structure manufacturing method as defined in claim 1, wherein the semiconductor device pressing operation is carried out by using the pressing tool including a tool body portion formed of a rigid material, the elastic member fixed to a lower surface of the tool body portion, and the pressing member attached at a center of a lower surface of the elastic member.

3. The semiconductor device mounted structure manufacturing method as defined in claim 1, wherein the semiconductor device pressing operation is carried out by using the pressing tool in which a metal plate is used as the pressing member.

4. The semiconductor device mounted structure manufacturing method as defined in claim 1, wherein the semiconductor device pressing operation is carried out by using the pressing tool in which the elastic member is formed so as to protrude from the flat surface of the pressing member.

5. The semiconductor device mounted structure manufacturing method as defined in claim 1, further comprising:

making the resin expand over the entire opposing area by a semiconductor device pressing operation with the pressing tool;

thereafter, hardening the seal-bonding resin, thereby forming a semiconductor device mounted structure in which the entire side faces of all peripheries of the semiconductor device are covered with the fillet portion.

6. The semiconductor device mounted structure manufacturing method as defined in claim 1, further comprising:

during the semiconductor device pressing operation by the pressing tool, pressing the seal-bonding resin filled into the space surrounded by the flat surface of the pressing tool, the elastic member and side faces of the semiconductor device with the elastic member, while deforming the elastic member; and thereafter, hardening the resin, thereby forming a semiconductor device mounted structure in which a concavely curved surface is formed in the fillet portion at positions close to corner portions of the semiconductor device.

7. The semiconductor device mounted structure manufacturing method as defined in claim 1, wherein during the semiconductor device pressing operation by the pressing tool, the seal-bonding resin is filled so as to form the space surrounded by the flat surface of the pressing tool, the elastic member and the side faces of the semiconductor device so that a space capacity close to corner portions of the semiconductor device become larger than a space capacity close to end portions between neighboring corner portions of the semiconductor device.

* * * * *